US006855613B1

(12) United States Patent
Hamm et al.

(10) Patent No.: US 6,855,613 B1
(45) Date of Patent: Feb. 15, 2005

(54) METHOD OF FABRICATING A HETEROJUNCTION BIPOLAR TRANSISTOR

(75) Inventors: Robert Alan Hamm, Staten Island, NY (US); Rose Fasano Kopf, Green Brook, NJ (US); Robert William Ryan, Piscataway, NJ (US); Alaric Tate, Chatham, NJ (US); Yu-Chi Wang, North Plainfield, NJ (US)

(73) Assignees: Lucent Technologies Inc., Murray Hill, NJ (US); Agere Systems Inc., Allentown, PA (US)

( * ) Notice: Subject to any disclaimer, the term of this patent is extended or adjusted under 35 U.S.C. 154(b) by 0 days.

(21) Appl. No.: 09/433,204

(22) Filed: Nov. 4, 1999

(51) Int. Cl.[7] ............................................. H01L 31/328
(52) U.S. Cl. ...................................... 438/312; 438/338
(58) Field of Search ................................ 438/312, 316, 438/338, 342, 602, 604, 605, 606

(56) References Cited

U.S. PATENT DOCUMENTS

| 4,214,966 A | | 7/1980 | Mahoney .................... 204/192 |
| 4,301,188 A | | 11/1981 | Niehaus ....................... 427/88 |
| 4,889,831 A | * | 12/1989 | Ishii et al. |
| 5,340,755 A | * | 8/1994 | Zwicknagl et al. ......... 438/312 |
| 5,420,052 A | * | 5/1995 | Morris et al. |
| 5,620,909 A | | 4/1997 | Lin et al. .................... 438/703 |
| 5,625,206 A | | 4/1997 | Chandrasekhar et al. ... 257/198 |
| 5,656,515 A | | 8/1997 | Chandrasekhar et al. ... 438/319 |
| 5,698,460 A | * | 12/1997 | Yang et al. |
| 5,801,093 A | * | 9/1998 | Lin ............................. 438/624 |
| 5,903,037 A | | 5/1999 | Cho et al. ................... 257/410 |
| 5,907,165 A | | 5/1999 | Hamm et al. ............... 257/197 |
| 6,137,125 A | * | 10/2000 | Costas et al. ............... 257/275 |
| 6,165,859 A | * | 12/2000 | Hamm et al. ............... 438/312 |
| 6,294,018 B1 | * | 9/2001 | Hamm et al. ................. 117/90 |
| 6,310,368 B1 | * | 10/2001 | Yagura ....................... 257/197 |

FOREIGN PATENT DOCUMENTS

| JP | 08-017798 | * | 1/1996 |
| JP | 10-050720 | * | 2/1998 |

OTHER PUBLICATIONS

Kouhei Morizuka et al., "AlGaAs/GaAs HBT's Fabricated by a Self-Alignment Technology Using Polyimide for Electrode Separation" IEEE, Electron Device Letters, vol. 9, No. 11 Nov. 1998, pp 598–600.*

"Evaluation of Encapsulation and Passivation of InGaAs/InP DHBT Devices for Long-Term Reliability", by Kopf, R. F. et al., *Journal of Electronic Materials*, vol. 27, No. 8, pp. 954–960 (1998).

"ECR Plasma Etch Fabrication of C-Doped Base InGaAs/InP DHBT Structures: A Comparison of $CH_4/H_2/Ar$ vs $BCl_3/N_4$ Plasma Etch Chemistries", by Kopf, R. F. et al., *Journal of Electronic Materials*, vol. 27, pp. 69–72 (1998).

"Gallium Arsenide Processing Techniques", by Williams, R. E., published by The Artech Microwave Library, pp. 126–129.

* cited by examiner

*Primary Examiner*—W. David Coleman
(74) *Attorney, Agent, or Firm*—Ozer M. N. Teitelbaum

(57) ABSTRACT

A method of fabricating a III-V heterostructure semiconductor device. The method includes the steps of forming at least one conductive post overlying a semiconductor region to form a structure, encapsulating the structure and the conductive post to form a planarized cured passivation layer, and exposing the conductive post through the planarized cured passivation layer to form the semiconductor device.

17 Claims, 3 Drawing Sheets

METHOD OF FABRICATING A HETEROJUNCTION BIPOLAR TRANSISTOR

CROSS-REFERENCE TO RELATED APPLICATIONS

Related subject matter is disclosed in co-pending, commonly assigned, U.S. patent application Ser. No. 09/396, 035, filed on Sep. 15, 1999, entitled "Alignment Techniques For Epitaxial Growth Processes."

FIELD OF THE INVENTION

The present invention relates to semiconductors, generally, and more particularly to a method of fabricating a heterostructure device, such as a Double Heterojunction Bipolar Transistor ("DHBT").

BACKGROUND OF THE INVENTION

III-V bipolar transistors are three terminal devices having three regions of alternating conductivity type, referred to as the emitter, base, and collector, constructed from III and V semiconductor compounds. One class of III-V bipolar transistors gaining notoriety is heterostructure devices—heterojunction bipolar transistors ("HBTs") and double heterojunction bipolar transistors ("DHBTs"). HBT and DHBTs include a junction between materials of differing composition, such as InGaAs and InP. In such an exemplary device structure, the InGaAs material has several known distinct properties from the InP material. These characteristics are detailed in depth in various references, including Sze, Physics of Semiconductor Device, Wiley-Interscience, 1969, pp. 17–24 and 140–146 (hereinafter "Sze"), Williams, Gallium Arsenide Processing Techniques, Artech House, Inc., 1984, pp. 17–35 and 79–82 (hereinafter "Williams"), and Streetman, Solid State Electronic Devices, Prentice-Hall, Inc., 1980, pp. 52–96, 395–399, and 424–428 (hereinafter "Streetman") which are hereby incorporated by reference.

Various methods of fabricating III-V DHBT devices are known in the art. Referring to FIG. 1, a multi-layer structure 5 is shown prior to undergoing the process steps for making a Ill-V DHBT device, as detailed in U.S. Pat. No. 5,907,165, commonly assigned with the present invention and hereby incorporated by reference. Structure 5 is grown using standard growth techniques as known in the art, such as Metal-Organic Molecular Beam Epitaxy (MO-MBE). Structure 5 comprises an InP substrate layer 10 on which a series of semiconductor layers 20 through 80 are sequentially grown. A subcollector layer 20 is formed overlying InP substrate layer 10 and comprises n+ doped InGaAs. Subcollector layer 20 also includes buffer layers to prevent unacceptable diffusion of impurities within the multilayer structure. The buffer layers comprise an n-doped InGaAs layer and an undoped InGaAs layer. An n– doped InP collector layer 30 is formed overlying subcollector layer 20.

III-V DHBTs are typically formed with buried junctions covered by thin graded quaternary layers to improve device reliability. Structure 5 of FIG. 1 comprises a base-collector and a base-emitter graded quaternary InGaAsP layer, 40 and 60, respectively. Collector-base graded quaternary layer 40 separates collector layer 30 from a base layer 50. Base layer 50 comprises a doped InGaAs. Collector-base graded quaternary layer 40 comprises a series of InGaAsP sublayers, including several buffer layers. These buffer layers are intended to improve transport characteristics and reduce current blocking, and comprise at least an n-doped InGaAs layer and an undoped InGaAs layer. Similarly, the emitter-base quaternary graded layer 60 comprises a series of InGaAsP sublayers for separating n-doped InP emitter layer 70 from base layer 50. Overlying emitter layer 70 is an n-type doped InGaAs emitter contact layer 80.

Referring to FIG. 2, a first series of steps are executed on the structure 5 of the known process is shown. Here, an emitter contact pad 90 is selectively formed overlying emitter contact layer 80 by a lift-off process, as is known in the art. A general description of the lift-off technique and its use may be found in U.S. Pat. Nos. 4,214,966, 5,620,909, 5,625,206, 5,656,515, and 5,903,037 each commonly assigned with the present invention, as well as Williams, pp. 125–127, all of which are incorporated herein by reference. Emitter contact 90 has a lateral dimension of approximately 3×5 $\mu$m.

As illustrated, emitter contact layer 80 is also wet or plasma etched using emitter contact pad 90 as an etch mask. An over-etch is performed to obtain an undercut as depicted under emitter contact pad 90 of 0.1 $\mu$m or more. Patterned contact layer 80 then serves as the etch mask for emitter layer 70 in a subsequent wet etch step. Subsequently, a base contact 100 is formed by evaporating a base contact metal using emitter contact pad 90 as a shadow mask to define the inner edge of base contact 100.

Subsequently, a base mesa is defined by a photolithographic resist step. The base mesa is thereafter selectively dry etched using $BCl_3/N_2$, thereby removing more than half the thickness of collector layer 30. The residual of collector layer 30 is then selectively wet etched and over-etched to produce an undercut. This undercut serves to reduce the base-collector capacitance of the III-V device. Thereafter, a collector contact 120 is deposited overlying the subcollector layer 20.

Referring to FIG. 3, a final series of steps are executed on the structure of FIG. 2 to create the known DHBT. First, the structure of FIG. 2 is passivated and encapsulated with a common layer 130, such as a polymer encapsulant. The device structure is then selectively dry etched to form via holes 140 through encapsulant layer 130. In so doing, access is gained to the collector, base and emitter metallization contacts, respectively, such that conductive plugs 150 are evaporated thereafter into via holes 140 to complete the device.

In the constant attempt to fabricate smaller III-V devices, it appears that the known art is limited to certain applications where the ability to finely dry etch via holes is not critical. Dry etching vias has proven effective for fabricating DHBTs having an emitter dimensions in the range of at least 2×4 $\mu$m to 3×5 $\mu$m. However, while the above known process for fabricating a III-V DHBT may provide, for smaller device construction, dry etching vias for a transistor having an emitter of less than 2×4 $\mu$m has proven difficult. At these dimensions, the dry etched vias are difficult to define using lithography. This is particularly relevant with respect to the base and emitter vias because of the intended smaller device size. Presently, in view of the drive for smaller devices, a commercial interest exists for a DHBT device with an emitter contact dimension of at least 1.2×3 $\mu$m, as well as a base and emitter contact spacing of less than 1 $\mu$m.

As a result, a method of manufacturing a DHBT is needed that will enable smaller device dimensions. Similarly, there is a demand for a process of fabricating a DHBT that is independent of dry etching vias to gain access to the base, emitter and collector contacts.

SUMMARY OF THE INVENTION

To achieve the many advantages of the present invention, a method of fabricating a III-V semiconductor device is disclosed. The semiconductor device comprises areas within a device structure with defined mesas, as well as base, emitter and collector contact pads. The method comprises the steps of forming at least one collector contact post overlying at least one the collector contact pad and forming at least one base contact post overlying at least one the base contact pad. Subsequently, a passivation layer is formed over the device structure with defined mesas, base, emitter and collector contact pads. The passivation layer is then cured. Thereafter, small segments of the encapsulating layer are exposed by performing an etch back step to fabricate a device and thereby reduce the dependence on via holes for gaining access to the base, emitter and collector contacts.

These and other advantages and objects will become apparent to those skilled in the art from the following detailed description read in conjunction with the appended claims and the drawings attached hereto.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations, and thus are not intended to portray the specific parameters or the structural details of the invention, which can be determined by one of skill in the art by examination of the information herein.

DETAILED DESCRIPTION OF THE PRESENT INVENTION

Figure 1:
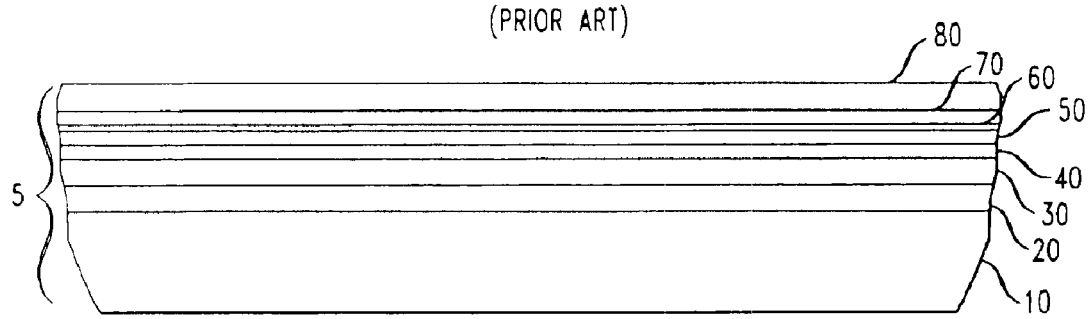
FIG. 1 is a cross-sectional view of a semiconductor substrate structure prior to undergoing steps of a known method.
Figure 2:
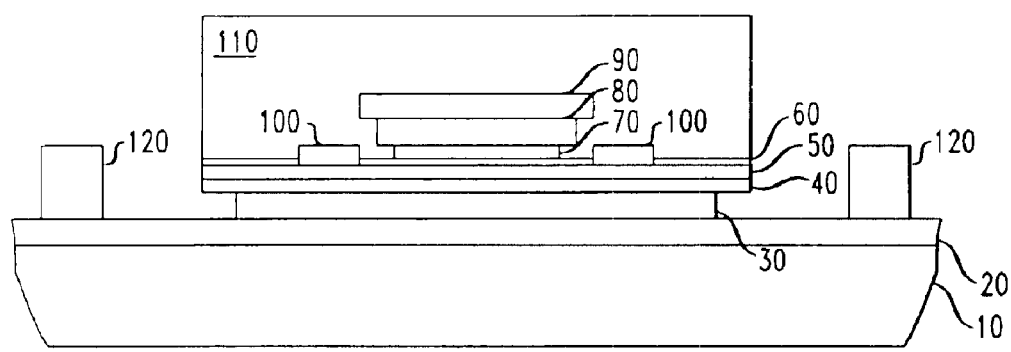
FIG. 2 is a cross-sectional view of the semiconductor substrate structure of FIG. 1 after undergoing a first series of steps according to the known method.
Figure 3:
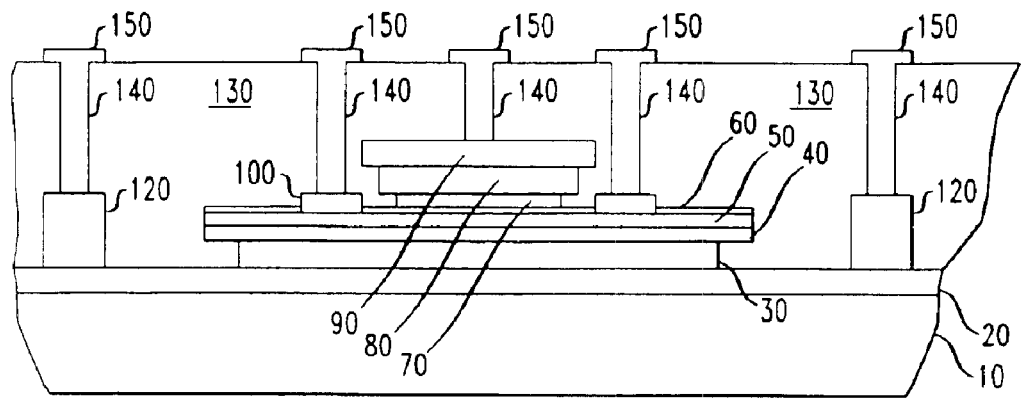
FIG. 3 is a cross-sectional view of the semiconductor substrate structure of FIG. 2 after undergoing a second series of steps to complete the device according to the known method.
Figure 4:
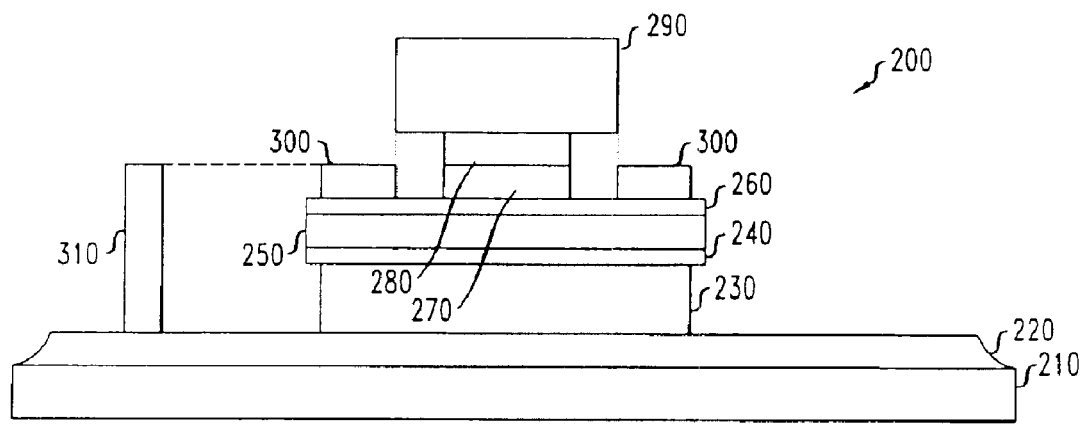
FIG. 4 is a cross-sectional view of a semiconductor structure prior to undergoing a first step of the present invention.

Referring to FIG. 4, a cross sectional view of a semiconductor structure 200 having defined mesas is illustrated prior to undergoing the steps of the present invention. Semiconductor structure 200 comprises an InP base substrate 210. Overlying InP layer 210 is a subcollector layer 220, also referred to as a collector contact layer. Subcollector layer 220 comprises n+ doped InGaAs and has an advantageous thickness in the approximate range of 2500 Å to 5000 Å. Subcollector layer 220 is doped $n^+$ with a dopant concentration of in the range of approximately $2\times10^{19}$ $cm^{-3}$ to $1\times10^{20}$ $cm^{-3}$. It is advantageous to use Sn as the n-type dopant, although other n-type impurities such as Si may also be employed. It is also beneficial for subcollector layer 220 to further comprise a series of buffer layers to prevent up-diffusion of impurities in the structure 200. These buffer layers comprise an n-doped InGaAs layer doped in the approximate range of $1\times10^{18}$ $cm^{-3}$ to $1\times10^{19}$ $cm^{-3}$ and having a thickness in the approximate range of 180 Å to 220 Å, as well as an undoped InGaAs layer having a thickness in the approximate range of 18 Å to 22 Å.

Formed overlying subcollector layer 220 is a collector layer 230. Collector layer 230 comprises InP. Collector layer 230 is n- doped with a concentration in the range of approximately $1\times10^{16}$ $cm^{-3}$ to $1\times10^{17}$ $cm^{-3}$. Collector layer 230 has a thickness in the approximate range of 2000 Å to 5000 Å.

Further, semiconductor structure 200 comprises a base-collector graded quaternary InGaAsP layer 240 overlying collector layer 230. It is advantageous for base-collector graded quaternary layer 240 to comprises a InGaAsP (approximately 1.13 eV) layer having a thickness approximately in the range of 115 Å to 145 Å and an InGaAsP (approximately 0.95 eV) layer having a thickness approximately in the range of 115 Å to 145 Å. Each InGaAsP layer is doped with a concentration level of in the range of approximately $1\times10^{17}$ $cm^{-3}$ to $1\times10^{18}$ $cm^{-3}$. It may be also beneficial for layer 240, alternatively, to comprise a buffer layer. In this alternate embodiment, the buffer layer advantageously comprises a graded InGaAsP layer that is n-doped approximately in the range of $1\times10^{17}$ $cm^{-3}$ to $1\times10^{18}$ $cm^{-3}$ and having a thickness in the approximate range of 270 Å to 300 Å, as well as an undoped InGaAs layer having a thickness in the approximate range of 180 Å to 220 Å.

Overlying base-collector graded quaternary InGaAsP layer 240 is a base layer 250. In an alternate embodiment, base layer 250 overlies the buffer layer. Base layer 250 comprises InGaAs. It is advantageous to dope InGaAs base layer 250 with carbon at a concentration in the approximate range of $2\times10^{19}$ $cm^{-3}$ to $1\times10^{20}$ $cm^{-3}$. Moreover, it is beneficial for InGaAs base layer 250 to have a thickness in the range of approximately 200 Å to 1000 Å.

In one embodiment of the present invention, semiconductor structure 200 additionally comprises a base-emitter graded quaternary InGaAsP layer 260 overlying base layer 250. Here, emitter-base quaternary graded layer 260 comprises at least one InGaAsP (approximately 0.95 eV) layer having a thickness in the range of approximately 65 Å to 85 Å. Alternatively, emitter-base quaternary graded layer 260 may comprise an InGaAsP (approximately 0.95 eV) layer and an InGaAsP (approximately 1.13 eV) layer having a combined thickness of approximately 125 Å to 155 Å. It should be noted, that in an alternative embodiment, semiconductor structure 200 does not comprises a base-emitter graded quaternary InGaAsP layer forming an abrupt junction.

Overlying a first portion of the base-emitter graded quaternary InGaAsP layer 260 is an emitter layer 270. Emitter layer 270 comprises InP n-doped with a concentration in the range of approximately $1 \times 10^{17}$ cm$^{-3}$ to $1 \times 10^{18}$ cm$^{-3}$. Emitter layer 270 comprises InP layer having a thickness in the range of approximately 400 Å to 800 Å, which is n– doped with a concentration in the range of approximately $2 \times 10^{17}$ cm$^{-13}$ to $1 \times 10^{18}$ cm$^{-3}$.

Emitter layer 270 supports an emitter contact layer 280. Emitter contact layer 280 comprises n+ type doped InGaAs having a dopant concentration of approximate $2 \times 10^{19}$ cm$^{-3}$ to $1 \times 10^{20}$ cm$^{-3}$. Emitter contact layer 280 also comprises a thickness in the range of approximately 500 Å to 2500 Å. In alternative embodiment, emitter contact layer 280 comprises n+ type doped InAs having a dopant concentration of approximate $2 \times 10^{19}$ cm$^{-3}$ to $1 \times 10^{20}$ cm$^{-3}$ and a thickness in the range of approximately 200 Å to 500 Å.

An emitter contact pad 290 is also formed overlying emitter contact layer 280. Emitter contact pad 290 comprises a Pt layer, having a thickness in the range of approximately 360 Å to 440 Å, overlying an Au layer, having a thickness in the range of approximately 1000 Å to 10,000 Å, overlying a Pt layer, having a thickness in the range of approximately 315 Å to 385 Å, overlying a Pd layer having a thickness in the range of approximately 45 Å to 55 Å. Pad 290 serves as a self-aligning etch mask in the formation of a base contact pad(s) 300. Prior to undergoing the process of the present invention, an over-etch step is performed on structure 200 to obtain an undercut of at least 500 Å underneath on pad 290. Contact pad 290 thereafter serves as the etch mask for the emitter layer 280 which in turn has an undercut of at least 500 Å created after an over etch step.

Moreover, at least one base contact pad 300 is formed overlying a portion of emitter-base graded quaternary layer 260. At least one collector contact pad 310, similarly, overlies subcollector layer 220. Base and collector contact pads 300 and 310 comprise a combination of Pd, Pt, and Au. Base contact pad(s) 300 comprises an Au layer having a thickness in the range of approximately 540 Å to 660 Å overlying a layer of Pt having a thickness in the range of approximately 360 Å to 440 Å, overlying a Pd layer having a thickness in the range of approximately 35 Å to 50 Å. Likewise, collector contact pad(s) 310 comprises a layer of Au having a thickness in the range of approximately 540 Å to 660 Å, overlying a layer of Pt having a thickness in the range of approximately 315 Å to 385 Å, overlying a layer of Pd having a thickness in the range of approximately 45 Å to 55 Å. It is advantageous for the collector pad(s) 310 to reach the height of base pad(s) 300, within +/–10 percent of each other, as depicted by the dotted lines in FIG. 4. To ensure the relative proper heights of the pads, the profile of the structure 200 may be checked with a DEKTAK stylus profilometry tool.

Figure 5:
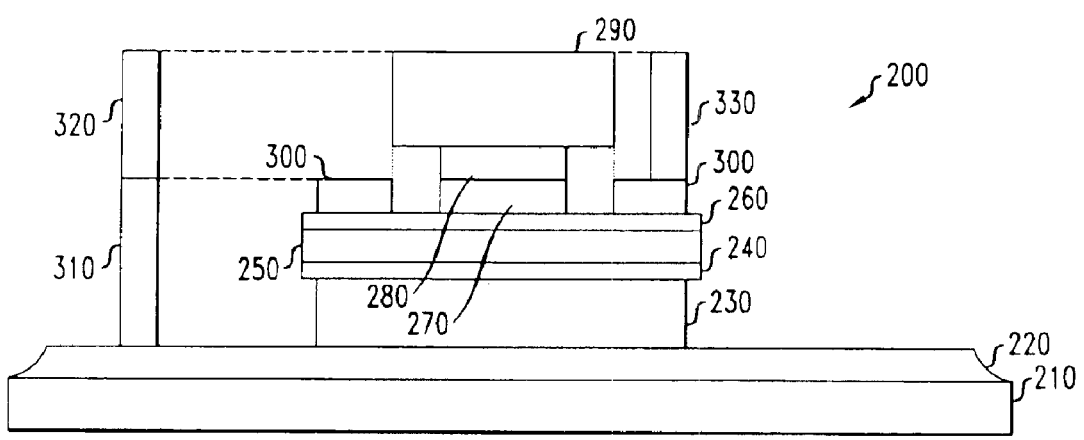
FIG. 5 is a cross-sectional view of the semiconductor substrate structure of FIG. 4 after undergoing a first step of the present invention.

Referring to FIG. 5, a cross-sectional view of a process step according to the present invention is illustrated. To provide sufficient electrical access to the double heterojunction bipolar transistor, at least one collector post 320 and at least one base post 330 are formed overlying a portion of collector pad(s) 310 and a portion of base pad(s) 300, respectively. From the cross-sectional profile of structure 200 and dotted lines depicted in FIG. 5, it should be apparent to one of ordinary skill that collector and base posts 320 and 330 are intended to reach the profile height of emitter contact pad 290, within approximately +/–10 percent (%). Similarly, one of ordinary skill should also recognize that the structure as well as its profile depicted in FIG. 5 are not drawn to scale.

The fabrication sequence for the structure of FIG. 5 is as follows. Collector and base posts 320 and 330 are formed using a lift-off technique. As detailed in the above referenced U.S. Pat. No. 4,214,966, the lift-off technique allows an intended space to "metallized" by delineating the space with a deposited material such as a photolithography resist. The chosen metal is then deposited by conventional methods, such as evaporation, to overly the delineated space an the deposited material. Subsequently, the photolithographic resist is then removed along with the chosen metal overlying the photolithographic resist such that delineated space is thereby defined and metallized.

In one embodiment of the present invention, collector and base posts 320 and 330 comprise a combination of Ti, Au and Pt. With these selected metals, it should be apparent to one of ordinary skill that the lift-off technique may be repeated to form collector and base posts 320 and 330.

In a further embodiment, collector and base posts 320 and 330 comprise a layer of Au having a thickness in the range of approximately of 5400 Å to 6600 Å, overlying a layer of Pt having a thickness in the range of approximately of 315 Å to 385 Å, overlying a layer of Ti having a thickness in the range of approximately of 45 Å to 55 Å. By selecting these dimensional criteria, collector and base posts 320 and 330 approximately reach the height of emitter contact pad 290 within a range of approximately 900 Å to 1000 Å.

Figure 6:
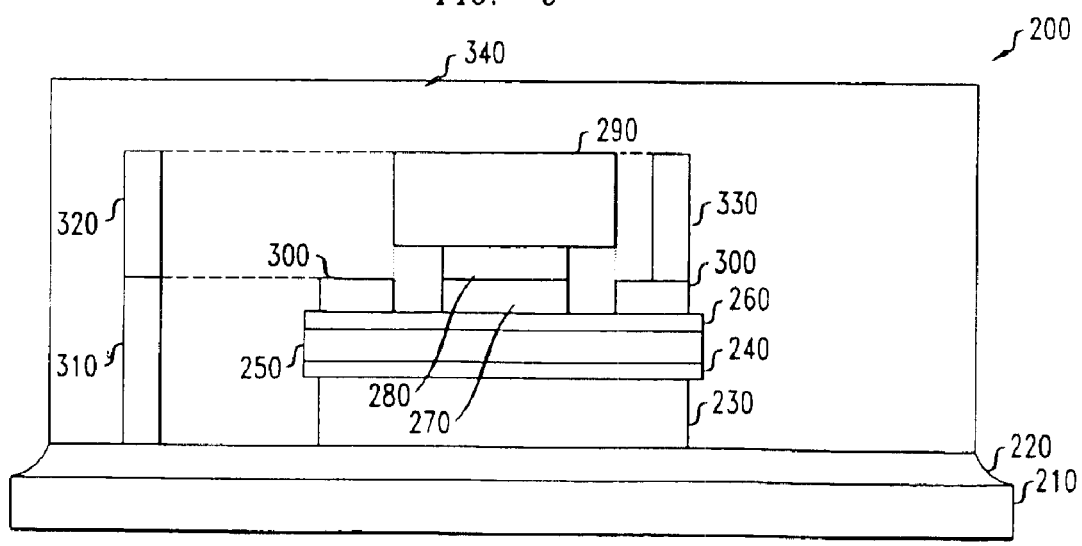
FIG. 6 is a cross-sectional view of a semiconductor substrate structure of FIG. 5 after undergoing a second step of the present invention.

Referring to FIG. 6, a cross-sectional view of the result of a second step of the present invention is illustrated. By forming collector and base posts 320 and 330, a resultant profile is created for the desired semiconductor device. A passivation layer 340 is then formed encapsulating the resultant semiconductor device to electrically isolate the device from the external environment and prevent damage and interference to the device elements. Passivation layer 340 is applied by spinning a suitable material onto the surface to produce a layer of polymer encapsulant. It is advantageous to use a polymer layer comprising benzocyclobutene ("BCB") created from the polymerization of Cyclotene™ made available by Dow Chemical for passivation layer 340. Alternate materials will be apparent to one of ordinary skill in the art, including Accuglass™ spin on glass made available by Allied Signal Inc. The BCB is spun on within a range 2000 to 5,000 revolutions per minute (rpm) for a period(s) ranging from 20 to 200 seconds. It is beneficial, in the present case, to spin on the BCB at 2000 RPM for 60 seconds, to reach a height of at least approximately twice the device structure, or within a range of at least approximate 1800 μm to 2200 μm.

Subsequently, structure 200 comprising passivation layer 340 is cured by a heating step. The curing step may be realized at a temperature of 300° C. in an atmosphere of $N_2$ for approximately 10 minutes. Heating times and temperatures can vary substantially and still yield acceptable results, though, and, as such, an approximate temperature range of 250 to 350° C., and a time having an approximate range of 1 to 30 minutes are operable conditions. It should be noted that alternate atmospheres during the heating step may also be employed, but advantageously should not include O2 at greater than 200 parts per million. The heating technique used in the processes described here was a conventional hot plate anneal step. However, other heating techniques may also be considered including, for example, Rapid Thermal Annealing ("RTA"), as well as the utilization of an oven or furnace.

In one embodiment of the present invention, the curing step comprises three individual sub-steps. Initially, a flush heating step is performed on structure 200 in an atmosphere of $N_2$ at a temperature range of approximately 45° C. to 55°

C. for approximately 30 minutes. Subsequently, a heating step in an atmosphere of $N_2$ at a temperature range of approximately 140° C. to 160° C. for approximately 60 minutes is executed. A second heating step is performed thereafter in an atmosphere of $N_2$ at a temperature range of approximately 250° C. to 350° C. for approximately 1–40 minutes.

During the curing process of the passivation layer, the metal pads and posts are annealed, generally. More specifically, base contact pad(s) 300 diffuses into and through (not shown) emitter-base graded quaternary layer 260 to make ohmic contact with base layer 250. Once encapsulated and heated, a planarization step is in effect completed on the heated encapsulated structure.

In one embodiment of the present invention, the passivation layer 340 is planarized as a result of executing two of the hereinabove steps. Upon performing the spinning step to form the passivation layer, the surface is planarized. In further embodiment of the present invention, passivation layer 340 is forty five percent (45%) to fifty five percent (55%) planarized by this spinning step, while the remaining amount of planarization is achieved by performing the hereinabove curing step. In yet a another embodiment of the present invention, this remaining amount of passivation layer 340 to be planarized is the result of executing the hereinabove heating step in an atmosphere of $N_2$ at a temperature range of approximately 140° C. to 160° C.

Figure 7:
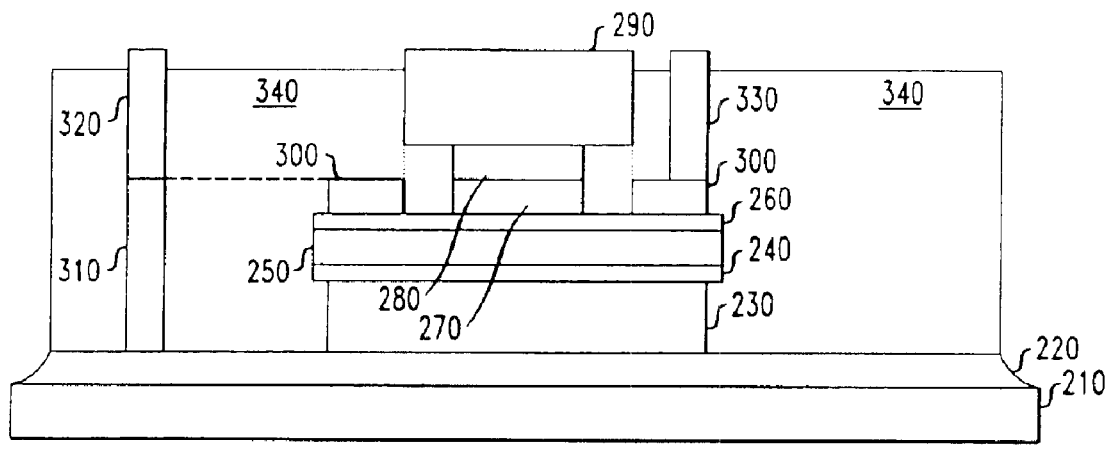
FIG. 7 is a cross-sectional view of a semiconductor substrate structure of FIG. 6 after undergoing a third step of the present invention.

Referring to FIG. 7, a cross-sectional view of a subsequent step of the present invention is illustrated. Here, a series of external contacts are formed. This step is realized by removing unwanted segments from layer 340 on the planarized, cured and encapsulated structure of FIG. 6. Using an etching step, portions of emitter contact pad 290, collector post 320 and base post 330 are exposed through layer 340.

In one embodiment of the present invention, a dry etch is employed for the etching step. The dry etch step is advantageously realized by a Reactive Ion Etch ("RIE") using a Plasma Therm SLR 770 system at a bias of 100V dc, and a pressure of approximately 15 mTorr. In an alternative embodiment, an Inductively Coupled Plasma ("ICP") or Electro Cycltron Resonance ("ECR") etch step may also be used. It is advantageous to use $CF_4:O_2$ at a ratio of 40:60 for this dry etch step. However, other fluorine-oxygen based etchants may be used, such as $SF_6:O_2$ at a ratio of 6:10, to obtain an etch rate of approximately 500 Å/minute. By this etch step, approximately 1000 Å to 5000 Å of passivation layer 340 are removed to ensure that posts 320 and 330 are exposed. Moreover, any residue from passivation layer 340 is removed as well. Thus, the base, emitter and collector are made accessible through the planarized, cured and encapsulated structure to enable subsequent interconnects for the completed III-V semiconductor device.

In still, yet another alternate embodiment of the present invention, an endpoint detection scheme is employed. Here, endpoint detection controls the etching of the planarized heated passivation layer 340. In this step, Optical Emission Spectroscopy ("OES") may be employed using an ISA SOFIE DIGISEM 550.

Figure 8:
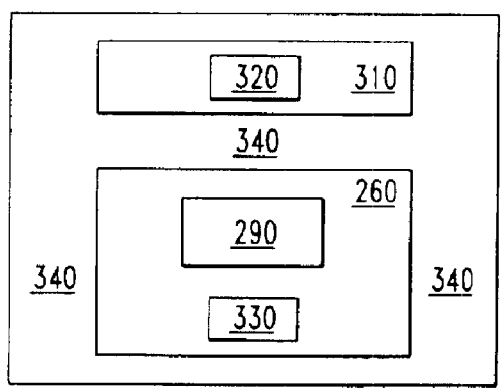
FIG. 8 is a top down view of a semiconductor substrate structure illustrated in FIG. 7.

Referring to FIG. 8, a top down view of the completed III-V semiconductor device as depicted in FIG. 7 is illustrated. From this vantage point, emitter contact pad 290, as well as collector and base posts 320, 330 are shown isolated by passivation layer 340. In one embodiment of the present invention, collector and base posts 320, 330 each have dimensions of 1.4×1.4 μm, emitter contact pad 290 is dimensionally 1.2×3 μm and spaced from base post 320 by 0.8 μm, while collector contact pad 310 is spaced 0.8 μm from emitter-base quaternary graded layer 260.

Figure 9:
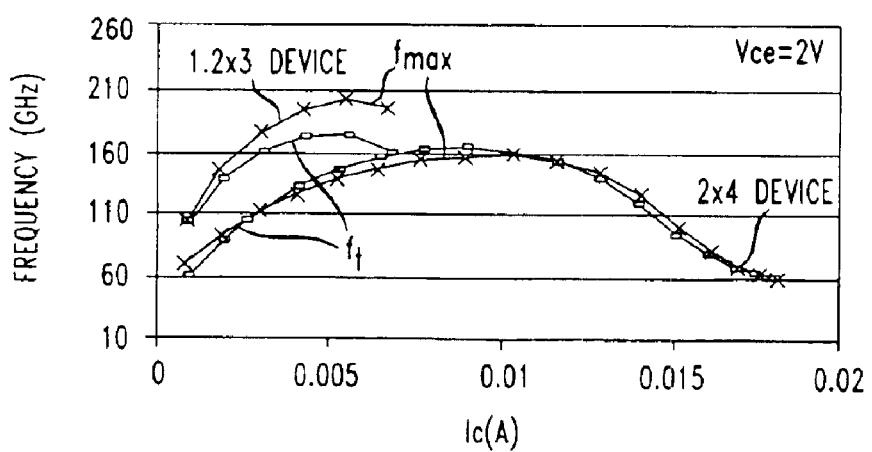
FIG. 9 is a graph illustrating the Frequency (GHz) versus Ic Current (A) characteristics of the resultant structure of the present invention.

Referring to FIG. 9, a graph of Frequency (GHz) versus Ic Current (A) characteristics is illustrated. Here, the radio frequency ("RF") performance of the hereinabove fabricated III-V semiconductor device is compared with a similar III-V semiconductor device having a larger emitter mesa size. As shown in FIG. 9, with the emitter size scaled down in size, a device cut-off frequency (fτ) remained substantially constant in the range of approximately 160 to 170 GHz. This is primarily attributable to the fact that fτ is primarily determined by the base-collector transit time. However, because of the reduced parasitics in the device created by closely spaced contacts and reduced base mesa area of the instant invention, the maximum frequency ($f_{MAX}$) of the device substantially increased from approximately 155 GHz to 200 GHz. It should be noted that the device parasitics, such as the base-collector capacitance, were reduced by the instant invention from approximately 25 fF to 12 fF.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Thus, while detailed the present invention details a process of fabricating a DHBT, it should be apparent to one of ordinary skill that the present invention may be applied to HBTs, as well as other semiconductor devices in need of the advantages and benefits of the present invention. It is therefore contemplated that the appended claims will cover any such modifications or embodiments as fall within the true scope of the invention.

What is claimed is:

1. A method of fabricating a semiconductor device having a semiconductor region, the method comprising the steps of:
   forming at least two conductive posts overlying the semiconductor region by at least a lift-off step to form a structure;
   encapsulating the structure and at least one of the at least two conductive posts to form a planarized cured passivation layer; and
   exposing the at least one of the at least two conductive posts protrudingly through the planarized cured passivation layer to form the semiconductor device.

2. The method of claim 1, wherein at least one of the at least two conductive posts comprise at least one of Pt, Au and Ti.

3. The method of claim 1, wherein the step of encapsulating the structure and at least one of the at least two conductive posts comprises the steps of;
   forming the passivation layer by spinning on benzocyclobutene ("BCB"); and
   heating the passivation layer in an $N_2$ atmosphere to a temperature substantially in the range of 250–350° C. for a period substantially in the range of 1–30 minutes, the passivation layer spun on, cured and planarized.

4. The method of claim 1, wherein the step of exposing the at least one of the at least two conductive posts comprises the step of etching the planarized cured passivation layer.

5. A method of fabricating a semiconductor device having a semiconductor region, the method comprising the steps of:

forming at least two conductive posts of about the same height by at least a lift-off step overlying the semiconductor region to form a structure;

encapsulating the structure and the at least two conductive posts to form a planarized cured passivation layer; and exposing the the at least two conductive posts protrudingly through the planarized cured passivation layer to form the semiconductor device.

6. The method of claim 5, wherein at least one of the at least two conductive posts comprises at least one of Pt, Au and Ti.

7. The method of claim 5 wherein the step of encapsulating the structure and at least one of the at least two conductive posts comprises the steps of:

forming the passivation layer by spinning on benzocyclobutene ("BCB"); and heating the passivation layer in an $N_2$ atmosphere to a temperature substantially in the range of 250–350° C. for a period substantially in the range of 1–30 minutes, the passivation layer spun on, cured and planarized.

8. The method of claim 5, wherein the step of exposing the at least one of the at least two conductive posts comprises the step of etching the planarized cured passivation layer.

9. The method of claim 8, wherein the step of etching the planarized cured passivation layer comprises a Reactive Ion Etching step.

10. The method of claim 9, wherein the Reactive Ion Etching step employs a chemistry of at least one of $CF_4:O_2$ at an approximate ratio of 40:60 and $SF_6:O_2$ at an approximate ratio of 6:10.

11. The method of claim 4, wherein the step of etching the planarized cured passivation layer comprises a Reactive Ion Etching step.

12. The method of claim 1, wherein the step of exposing reduces a height of the planarized cured passivation layer beneath or equal to a height of the at least one of the at least two conductive posts.

13. The method of claim 5, wherein the step of exposing reduces a height of the planarized cured passivation layer beneath or equal to a height of the at least one of the at least two conductive posts.

14. The method of claim 11, wherein the Reactive Ion Etching step employs a chemistry of at least one of $CF_4:O_2$ at an approximate ratio of 40:60 and $SF_6:O_2$ at an approximate ratio of 6:10.

15. A method of fabricating a semiconductor device having a semiconductor region, the method comprising the steps of:

forming at least one conductive post overlying the semiconductor region to form a structure;

encapsulating the structure and the at least one conductive post to form a planarized cured passivation layer; and etching the planarized cured passivation layer causing the encapsulated at least one conductive post to protrude through the planarized cured passivation layer and form the semiconductor device.

16. The method of claim 15, wherein the step of etching reduces a height of the planarized cured passivation layer beneath or equal to a height of the at least one conductive post.

17. The method of claim 16, wherein the step of etching comprises:

masking a portion of the encapsulated structure, the portion corresponding with a position of the encapsulated at least one conductive post.

* * * * *